(12) United States Patent
Liang et al.

(10) Patent No.: US 6,222,260 B1
(45) Date of Patent: Apr. 24, 2001

(54) INTEGRATED CIRCUIT DEVICE WITH INTEGRAL DECOUPLING CAPACITOR

(75) Inventors: Dexin Liang, Fremont; Ray Killorn, San Jose, both of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/074,564

(22) Filed: May 7, 1998

(51) Int. Cl.[7] ................................................. H01L 23/52
(52) U.S. Cl. .................... 257/691; 257/686; 257/687; 257/722; 257/723; 257/725; 257/701; 257/676; 257/678; 257/666; 257/784
(58) Field of Search .................... 257/666, 676, 257/678, 532, 691, 722, 723, 725, 777, 686, 687, 700, 701, 784; 361/306.1, 306.2

(56) References Cited

U.S. PATENT DOCUMENTS

| | | | |
|---|---|---|---|
| 4,734,818 | * | 3/1988 | Hernandez et al. ................. 361/306 |
| 4,744,088 | | 5/1988 | Black et al. . |
| 4,754,366 | * | 6/1988 | Hernandez et al. ............... 361/306.2 |
| 4,882,656 | | 11/1989 | Menzies, Jr. et al. . |
| 5,034,850 | | 7/1991 | Hernandez et al. . |
| 5,049,979 | * | 9/1991 | Hashemi et al. ..................... 257/723 |
| 5,095,402 | * | 3/1992 | Hernandez et al. ................. 361/306 |
| 5,272,590 | * | 12/1993 | Hernandez et al. ............... 361/306.2 |
| 5,304,506 | | 4/1994 | Porter et al. . |
| 5,366,931 | | 11/1994 | Kim . |
| 5,498,906 | | 3/1996 | Roane et al. . |
| 5,583,739 | | 12/1996 | Vu et al. . |
| 5,587,333 | | 12/1996 | Johansson et al. . |
| 5,606,197 | | 2/1997 | Johansson et al. . |
| 5,656,834 | | 8/1997 | Grzyb et al. . |
| 5,668,399 | | 9/1997 | Cronin et al. . |
| 5,701,032 | | 12/1997 | Fischer et al. . |
| 5,814,892 | * | 9/1998 | Steidl et al. ......................... 257/784 |
| 5,903,050 | * | 5/1999 | Thurairajaratnam et al. ........ 257/695 |

* cited by examiner

*Primary Examiner*—Tom Thomas
*Assistant Examiner*—Luan Thai
(74) *Attorney, Agent, or Firm*—Mikio Ishimaru

(57) ABSTRACT

A flat, thin decoupling capacitor is disposed inside an integrated circuit device in a coplanar relationship with a semiconductor chip and a bonding element. When connected to the power and ground plane of a device substrate or in a leadframe device, the decoupling capacitor is positioned close to the semiconductor chip to substantially reduce ground bounce and crosstalk from the semiconductor chip. When the decoupling capacitor is positioned to locate the semiconductor chip between itself and the device substrate or leadframe device, the decoupling capacitor shields electromagnetic interference from the semiconductor chip.

9 Claims, 3 Drawing Sheets

INTEGRATED CIRCUIT DEVICE WITH INTEGRAL DECOUPLING CAPACITOR

TECHNICAL FIELD

The present invention relates generally to integrated circuit devices and more specifically to integrated circuit devices with decoupling capacitors.

BACKGROUND ART

As ultra large-scale integrated circuits have continued to evolve, they have become more complex with the need to switch more and more output driver circuits at higher and higher speeds. In addition, an increase in the use of parallel processing has necessitated designing circuits with a high number of driver circuits to switch simultaneously at fast transition speeds and high currents. Since the effective inductance of semiconductor chips for these active switching circuits is directly related to the amount of power distribution noise, the driver circuit power connections are particularly sensitive to the noise created by the effective inductance inherent in simultaneous switching activity. Numerous techniques have been developed using decoupling capacitors to reduce power supply transients, ground bounce, and high frequency inductive delay.

The earliest techniques involved positioning the decoupling capacitors as discrete components on the printed circuit board adjacent to the integrated circuit device. However, the length of the connections of the decoupling capacitors to the integrated circuit devices added unwanted inductances and introduced further noise.

Since it is desirable to have the decoupling capacitors as close to the integrated circuit as possible to maximize the benefits of the decoupling capacitor, subsequent designs located the decoupling capacitors as small, discrete devices above or below the associated integrated circuit device. While this approach provided some improvement, the difficulty of making the manufacturing interconnections to the integrated circuit device or to the circuit board and the still relatively long connections continued to be less than optimal.

Subsequently, many different approaches were developed to photolithographically place the decoupling capacitors "on-chip" on the semiconductor chips themselves.

Where the decoupling capacitors were placed on the surface of the silicon chip as part of the integrated circuit, maximum reduction of negative effects was achieved, but at an exorbitant cost in highly valuable silicon real estate.

Where the decoupling capacitors were integrated over the circuitry of the semiconductor chips as part of the semiconductor manufacturing process, additional processing steps were required which introduced additional complexity, which reduced yield and made the resulting integrated circuits more expensive.

A simple, elegant solution has long been sought for providing inexpensive integrated circuit devices with decoupling capacitors that reduce power supply transients, ground bounce, and high frequency inductive delay. As indicated by the many different approaches to the inherent problems, a solution has long eluded those skilled in this art.

DISCLOSURE OF THE INVENTION

The present invention provides an integrated circuit device having a planar decoupling capacitor integral with a planar semiconductor chip and a planar bonding element. The three are coplanar and located in a fixed relationship which places the planar decoupling capacitor as close to the planar semiconductor chip as possible without having the performance problems of being outside the integrated circuit device or having the processing problems of being on-chip.

An advantage of the present invention is to provide an integrated circuit device having an integral decoupling capacitor which provides semiconductor chip performance improvements while being easily manufactured with current technology.

Another advantage of the present invention is to provide an integrated circuit device in which the decoupling capacitor is close to the semiconductor chip to reduce ground bounce in the semiconductor chip.

Another advantage of the present invention is to provide an integrated circuit device in which the decoupling capacitor is close to the semiconductor chip to reduce crosstalk in the semiconductor chip.

Another advantage of the present invention is to provide an integrated circuit device in which the decoupling capacitor is close to and positioned to shield the semiconductor chip to reduce electro-magnetic interference from the semiconductor chip.

Another advantage of the present invention is to provide an integrated circuit device in which the decoupling capacitor is close to the semiconductor chip and can provide a large capacitance to the semiconductor chip.

Another advantage of the present invention is to provide an integrated circuit device in which the decoupling capacitor is close to the semiconductor chip and can provide a number of different capacitances to the semiconductor chip.

Another advantage of the present invention is to provide an integrated circuit device with an integral decoupling capacitor which is easy to assemble and is easily compatible with current device assembly processes.

Another advantage of the present invention is to provide an integrated circuit device with an integral decoupling capacitor which is more compact than conventional combinations of the semiconductor chip with a separate decoupling capacitor.

The above and additional advantages of the present invention will become apparent to those skilled in the art from a reading of the following detailed description when taken in conjunction with the accompanying drawings.

BEST MODES FOR CARRYING OUT THE INVENTION

Figure 1:
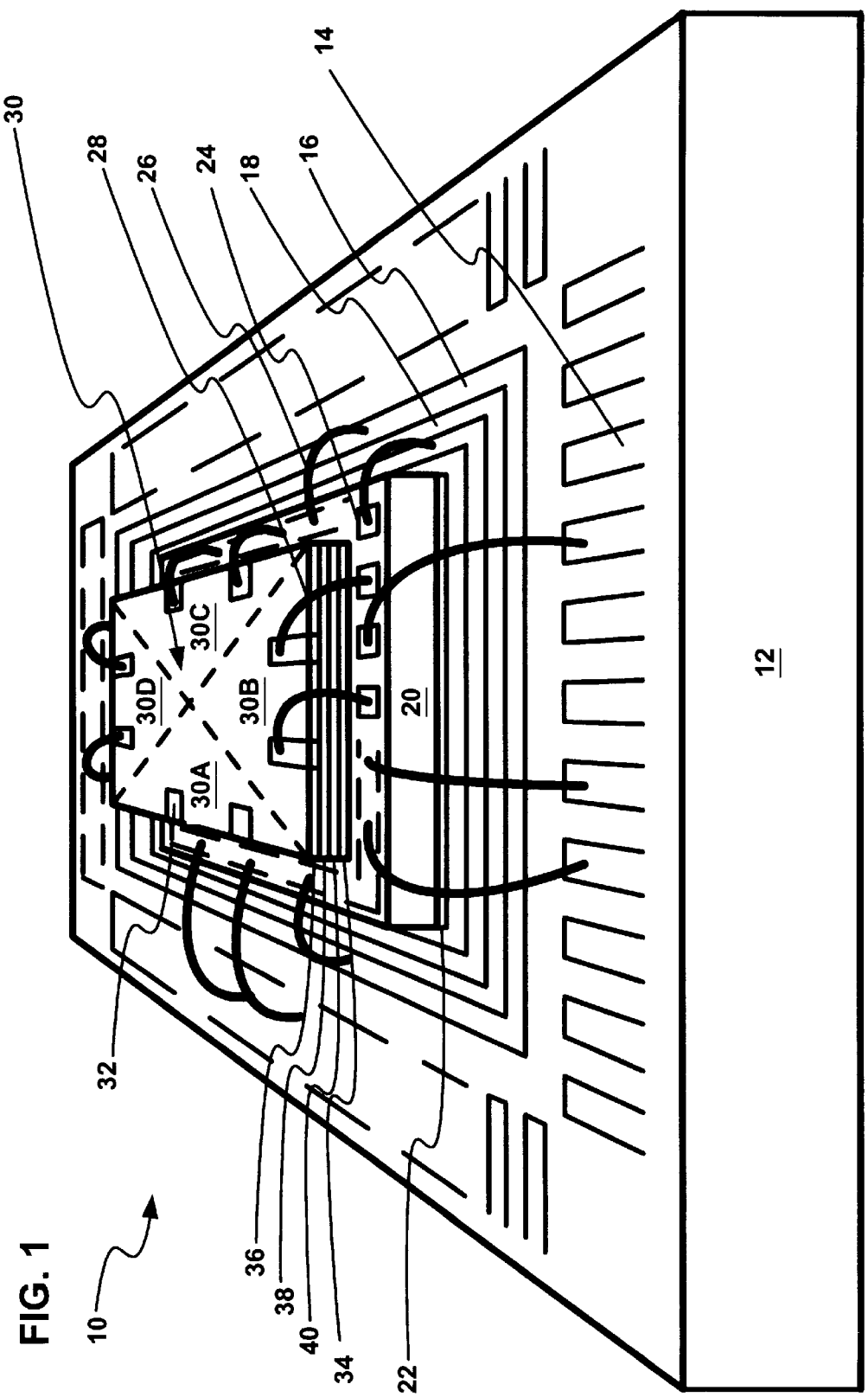
FIG. 1 is an isometric view of an integrated circuit device having a semiconductor chip positioned between a decoupling capacitor and a device substrate.

Referring now to FIG. 1, therein is shown an integrated circuit device 10 which includes a bonding element, which is the interface to integrated circuit device package leads (not shown). In FIG. 1, the bonding element is a planar, device substrate 12. The device substrate 12 has a plurality of bond fingers 14 around its periphery. Within the bond fingers 14 are a power ring 16 and a ground ring 18. Within the power ring 16 and ground ring 18 is a planar semiconductor chip 20, which is bonded to the device substrate 12 by a die attach adhesive 22.

The semiconductor chip 20 has its circuitry located on top near the plurality of bonding pads 24 around its upper periphery, as shown in FIG. 1. The plurality of bonding pads 24 are connected internally to the circuitry in the semiconductor chip 20 and by a plurality of wire connectors 26 to the bond fingers 14, the power ring 16, and the ground 18. The plurality of bonding pads 24 are also connected through a plurality of wire connectors 28 to a planar decoupling capacitor generally designated 30.

The decoupling capacitor may be a single capacitor 30 or a segmented capacitor, as indicated by the dotted lines, which form a plurality of capacitors 30A, 30B, 30C, and 30D. Each of the capacitor segments can have a custom capacitance as required to tune various circuits in the semiconductor chip 30. The wire connectors 28 are connected to a plurality of bonding tabs 32 on the decoupling capacitor 30.

The decoupling capacitor 30 is bonded to the semiconductor chip 20 by a low dielectric, nonconductive adhesive 34. The decoupling capacitor 30 consists of a top plate 36, a dielectric 38, and a bottom plate 40. The top plate 36 and a bottom plate 40 are connected to various of the plurality of bonding tabs 32.

Figure 2:
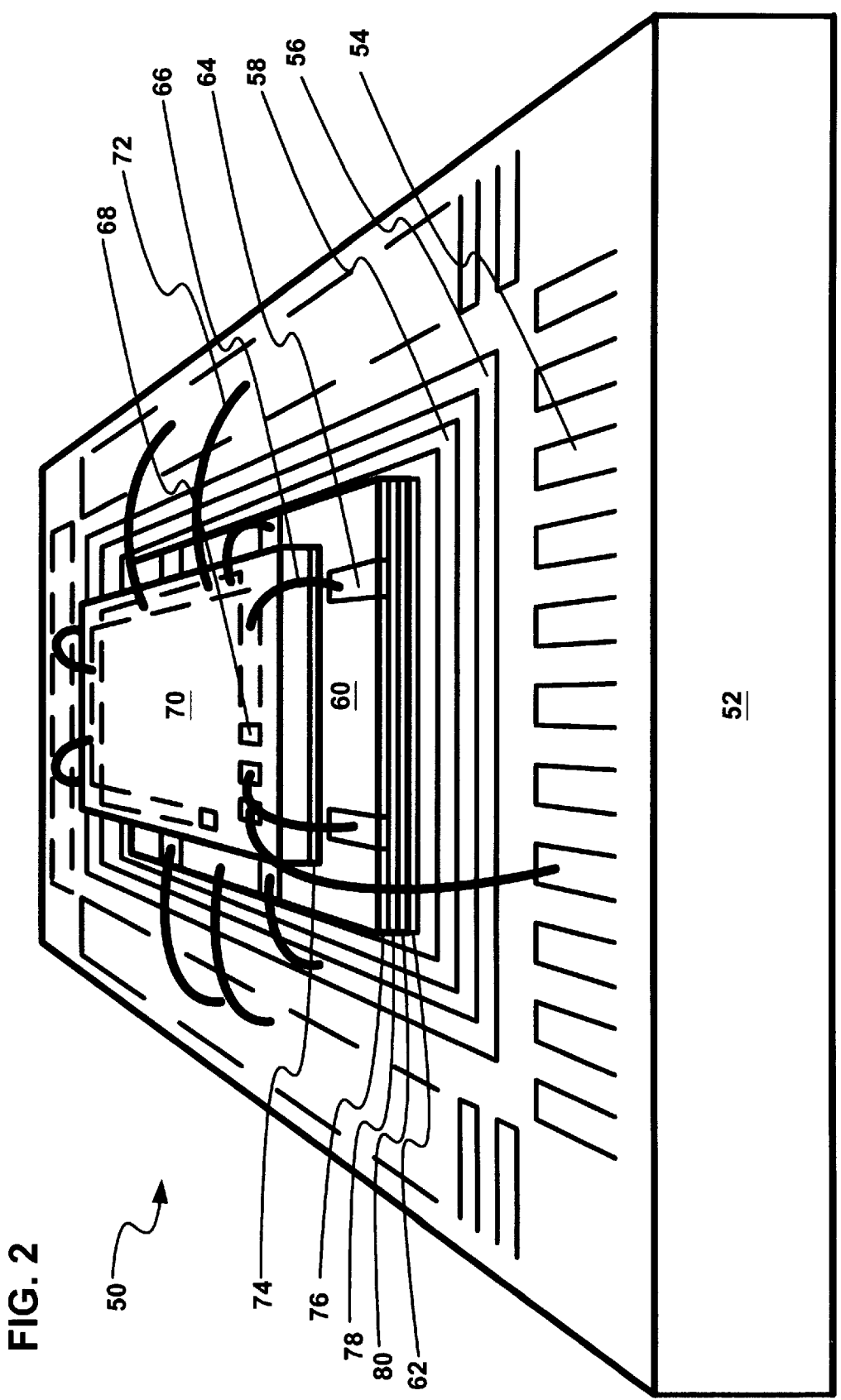
FIG. 2 is an isometric view of an integrated circuit device having a decoupling capacitor positioned between a semiconductor chip and a device substrate.

Referring now to FIG. 2, therein is shown an integrated circuit device 50 which includes a device substrate 52. The device substrate 52 has a plurality of bond fingers 54 around its periphery. Within the bond fingers 54 are a power ring 56 and a ground ring 58. Within the power ring 56 and ground ring 58 is a flat, thin decoupling capacitor 60, which is bonded to the device substrate 52 by an adhesive 62.

The decoupling capacitor 60 has plurality of bonding tabs 64 around its periphery. The plurality of bonding tabs 64 are connected by a plurality of wire connectors 66 to a plurality of bonding pads 68 on an semiconductor chip 70. The plurality of bonding pads 68 on the semiconductor chip 70 are also connected by a plurality of wire connectors 72 to the bond fingers 54, the power ring 56, and the ground ring 58.

It should be noted that an eutectic alloy could be used in place of the adhesive 62 to provide an electrical bond. The decoupling capacitor 60 would soldered directly to the bond fingers 54, the power ring 56, and/or the ground ring 58 on the substrate 52 depending on how the fingers and rings are laid out.

The semiconductor chip 70 is bonded to the decoupling capacitor 60 by an adhesive 74. The decoupling capacitor 30 is a conventional, thin, planar capacitor which consists of a top plate 76, a dielectric 78, and a bottom plate 80.

Figure 3:
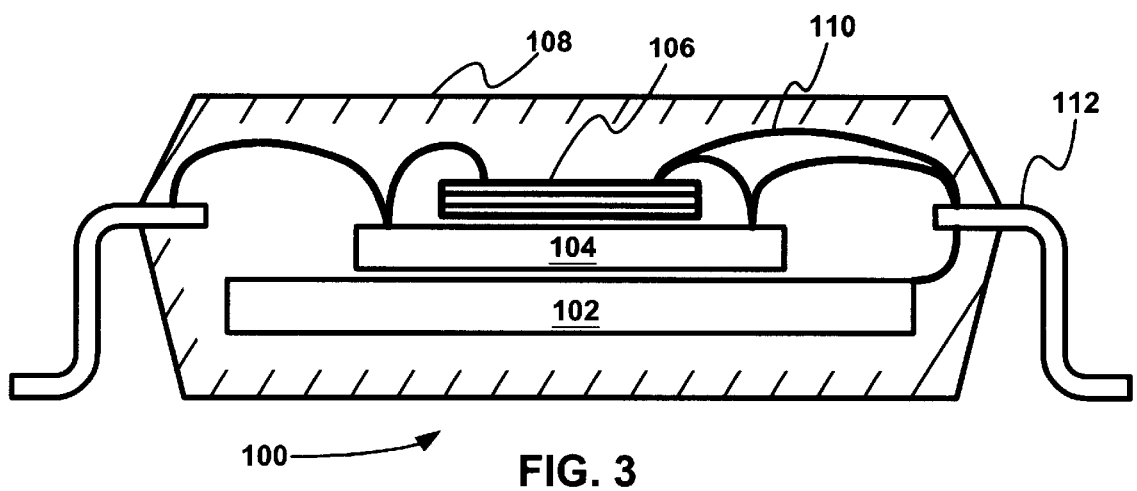
FIG. 3 is a cross-section of an integrated circuit device having a semiconductor chip embedded between a decoupling capacitor and a leadframe die paddle.

Referring now to FIG. 3, therein is shown an integrated circuit device 100 which includes a leadframe die paddle 102 as the bonding element, an semiconductor chip 104, and a decoupling capacitor 106.

The leadframe die paddle 102 is the equivalent of the bond fingers 14 on the device substrate 12 of FIG. 1, and the various wire connectors are bonded to it. The semiconductor chip 104 and the decoupling capacitor 106 are the same as the semiconductor chip 20 and the decoupling capacitor 30, respectively, of FIG. 1.

For wire bonding, a die attach adhesive may still be necessary, but subsequently, all three components are embedded in an encapsulant 108, such as epoxy. If the dielectric constant of the epoxy or adhesive is too high to provide capacitive isolation between the components, low dielectric constant separators may be required, but the need for such separators could easily be determined by those skilled in the art. Any separators would be held in place by the encapsulant 108.

The leadframe die paddle 102, the semiconductor chip 104, and the decoupling capacitor 106 are connected by wire connectors 110 to leads 112 which are used to mount the semiconductor device 100 to printed circuit boards (not shown).

Figure 4:
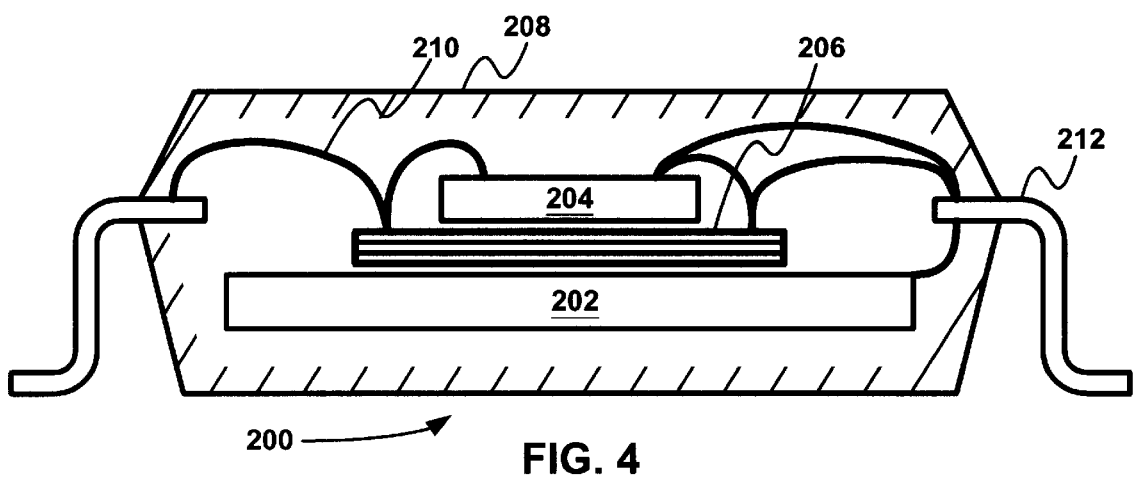
FIG. 4 is a cross-section of an integrated circuit device having a decoupling capacitor embedded between a semiconductor chip and a leadframe die paddle.

Referring now to FIG. 4, therein is shown an integrated circuit device 200 which includes a leadframe die paddle 202, a decoupling capacitor 204, and an semiconductor chip 206.

The leadframe die paddle 202 is the equivalent of the bond fingers 54 on the device substrate 52 of FIG. 2, and the various wire connectors are bonded to it. The decoupling capacitor 204 and the semiconductor chip 206 are the same as the decoupling capacitor 60 and the semiconductor chip 70, respectively, of FIG. 2.

For wire bonding, a die attach adhesive may still be necessary, but subsequently, all three components are embedded in an encapsulant 208, such as epoxy. If the dielectric constant of the epoxy or adhesive is too high to provide capacitive isolation between the components, low dielectric constant separators may be required, but the need for such separators could easily be determined by those skilled in the art. Any separators would be held in place by the encapsulant 208.

The leadframe die paddle 202, the semiconductor chip 104, and the decoupling capacitor 106 are connected by wire connectors 210 to leads 212 which are used to mount the semiconductor device 200 to printed circuit boards (not shown).

Figure 5:
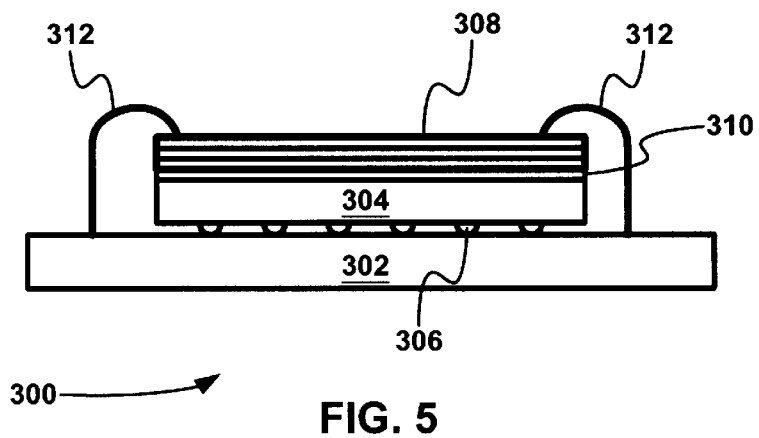
FIG. 5 is a cross-section of a an integrated circuit device having a semiconductor flip-chip positioned between a decoupling capacitor and a device substrate.

Referring now to FIG. 5, therein is shown an integrated circuit device 300 which includes a device substrate 302, an semiconductor flip-chip 304, and a decoupling capacitor 308.

The device substrate 302 is similar to the device substrate 12 of FIG. 1 with the bond fingers in a array pad format. The semiconductor chip 304 is a ball grid array, flip chip. With a ball grid array 306, the internal circuitry is connected to a more densely packed array of half-ball connectors on the top of the semiconductor flip-chip 304 than can be achieved by bonding pads. Being a flip-chip, the semiconductor chip 304 is flipped over during installation so the top with the ball-grid array 306 is on the bottom as shown in FIG. 5. The ball-grid array matches the array pad format of the device substrate 302. The decoupling capacitor 308 is then bonded with an adhesive into position over the bottom of the semiconductor chip 304.

In the arrangement shown in FIG. 5, the thin decoupling capacitor 308 can be as large or larger than the semiconductor chip 304 and act as a Faraday cage to contain electro-magnetic interference (EMI) from the semiconductor chip 304. At the higher frequencies, especially in the gigahertz switching range, electro-magnetic radiation from integrated circuit components create severe problems which often require EMI shielding of the entire equipment in which the semiconductor devices are installed.

The semiconductor chip 304 is held to the device substrate 302 by solder or other connection, and the decoupling capacitor held to the semiconductor chip 304 by an adhesive 310.

The decoupling capacitor 308 and the device substrate 302 are connected by wire connectors 312. The electrical bond could again also be achieved by forming the plates of decoupling capacitor 308 to allow an eutectic solder connection.

In use, the semiconductor device 10 of FIG. 1 has the semiconductor chip 20 connected to receive and send signals to the bond fingers 14. The semiconductor chip 20 in turn receives power from the power ring 16 and is grounded to the ground ring 18. The decoupling capacitor 30 has the top plate 36 connected to the ground ring 18 and the bottom plate 40 connected to the power ring 16. This reduces the ground bounce and crosstalk of the semiconductor chip 20. In addition, with the semiconductor chip 20 positioned between the device substrate 12 and the decoupling capacitor 30, a large portion of the electro-magnetic interference generated by the semiconductor chip 20 will be shielded.

Similarly, in use, the semiconductor device 50 of FIG. 2 has the semiconductor chip 70 connected to receive and send signals to the bond fingers 54. The semiconductor chip 70 in turn receives power from the power ring 56 and is grounded to the ground ring 58. The decoupling capacitor 60 has the top plate 76 connected to the ground ring 58 and the bottom plate 80 connected to the power ring 56. This reduces the ground bounce and crosstalk of the semiconductor chip 70 in the same way as in the semiconductor device 10. However, the semiconductor device 50 has the capability of containing a much larger capacitor, or a number of significant capacity capacitors if the decoupling capacitor 60 is segmented.

In use, the semiconductor device 100 of FIG. 3 has the semiconductor chip 104 connected to receive and send signals to the leads 112. The semiconductor chip 104 in turn receives power from and is grounded by the leads 112. The decoupling capacitor 106 is connected to the appropriate leads 112 to reduce the ground bounce and crosstalk of the semiconductor chip 104. In addition, with the semiconductor chip 104 positioned between the leadframe die paddle 102 and the decoupling capacitor 108, a large portion of the electro-magnetic interference generated by the semiconductor chip 104 will be shielded.

Similarly, in use, the semiconductor device 200 of FIG. 4 has the semiconductor chip 206 connected to receive and send signals leads 212. The semiconductor chip 206 in turn receives power from and is grounded to the leads 212. The decoupling capacitor 204 is connected to the appropriate leads 212 to reduce the ground bounce and crosstalk of the semiconductor chip 70 in the same way as in the semiconductor device 50. However, the semiconductor device 200 has the capability of containing a much larger capacitor, or a number of significant capacity capacitors if the decoupling capacitor 204 is segmented.

In use, the semiconductor device 300 of FIG. 5 has the semiconductor chip 304 with the ball-grid array 306 soldered to and connected to the device substrate 302. The semiconductor chip 304 in turn receives power from and is grounded by the balls in the ball-grid array 306 to the grid array pads on the device substrate 302. The decoupling capacitor 306 is connected by the appropriate leads 312 to the appropriate grid array pads on the device substrate 302 to reduce the ground bounce and crosstalk of the semiconductor chip 304. With the semiconductor chip 304 being equipped with a ball-grid array 306, it allows the decoupling capacitor 306 to be much larger or contain a number of different capacitors. In addition, with the semiconductor chip 304 positioned between the device substrate 302 and the large decoupling capacitor 308, most of the electromagnetic interference generated by the semiconductor chip 304 will be shielded.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the appended claims. All matters set forth herein or shown in the accompanying drawings are to be interpreted in an illustrative and non-limiting sense.

The invention claimed is:

1. An integrated circuit device comprising:
   a planar bonding element having a planar surface, said bonding element having a plurality of bond fingers and concentric power and ground rings on said planar surface;
   a planar semiconductor chip positioned within said concentric power and ground rings on said planar bonding element and connected to said planar bonding element and to said concentric power and ground rings, said planar semiconductor chip being coupled to said plurality of bond fingers and to said concentric power and ground rings by a plurality of wires; and
   a planar decoupling capacitor integral with said planar semiconductor chip and said bonding element, said planar decoupling capacitor being positioned close to and connected to said planar semiconductor chip, said planar decoupling capacitor disposed in a parallel planar relationship with said planar semiconductor chip and said planar bonding element, said planar semiconductor chip disposed between said planar decoupling capacitor and said planar bonding element, said planar decoupling capacitor is in close proximity to and bonded to said planar semiconductor chip by a non-conductive adhesive.

2. The integrated circuit device as claimed in claim 1 wherein said planar decoupling capacitor is segmented to form a plurality of capacitors.

3. The integrated circuit device as claimed in claim 1 wherein said plurality of capacitors has different capacitances.

4. The integrated circuit device as claimed in claim 1 wherein said planar semiconductor chip and said planar decoupling capacitor are disposed in and encapsulated by a nonconductive encapsulant.

5. An integrated circuit device comprising:
   a device substrate having a planar surface and concentric power and ground rings on said planar surface;
   a planar semiconductor chip positioned within said concentric power and ground rings on said planar bonding element and connected to said device substrate and said concentric power and ground rings, said semiconductor chip being a flip chip and having a plurality of circuitry disposed thereon; and
   a planar decoupling capacitor integral with said planar semiconductor chip and said device substrate, said planar decoupling capacitor being positioned close to and connected to said plurality of circuitry on said planar semiconductor chip, said planar decoupling capacitor in a parallel planar relationship with said planar semiconductor chip and said device substrate, said planar semiconductor chip disposed between said planar decoupling capacitor and said device substrate, said planar decoupling capacitor is in close proximity to and bonded to said planar semiconductor chip by an adhesive.

6. The integrated circuit device as claimed in claim 5 wherein said planar decoupling capacitor is segmented to form a plurality of capacitors, said plurality of capacitors has different capacitances and is connected to said plurality of circuitry disposed on said planar semiconductor chip.

7. The integrated circuit device as claimed in claim 5 wherein said planar decoupling capacitor planar is sized to act as a Faraday cage for said planar semiconductor chip.

8. An integrated circuit device comprising:

a bonding element having a planar surface and concentric power and ground rings on said planar surface;

a planar semiconductor chip positioned within said concentric power and ground rings on said planar bonding element and connected to said planar bonding element; and a planar decoupling capacitor integral with said planar semiconductor chip and said bonding element, said planar decoupling capacitor being positioned close to and connected to said planar semiconductor chip, said planar decoupling capacitor segmented to form a plurality of capacitors, said planar decoupling capacitor disposed in a parallel planar relationship with said planar semiconductor chip and said planar bonding element, said planar decoupling capacitor disposed between said planar semiconductor chip and said planar bonding element.

9. The integrated circuit device as claimed in claim 8 wherein said plurality of capacitors has different capacitances.

* * * * *